(12) United States Patent
Jian et al.

(10) Patent No.: US 8,193,845 B2
(45) Date of Patent: Jun. 5, 2012

(54) BINARY-WEIGHTED DELTA-SIGMA FRACTIONAL-N FREQUENCY SYNTHESIZER WITH DIGITAL-TO-ANALOG DIFFERENTIATORS CANCELING QUANTIZATION NOISE

(75) Inventors: Heng-Yu Jian, San Diego, CA (US);
Zhiwei Xu, Los Angeles, CA (US);
Yi-Cheng Wu, Los Angeles, CA (US);
Mau-Chung Frank Chang, Los Angeles, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 12/831,208

(22) Filed: Jul. 6, 2010

(65) Prior Publication Data
US 2012/0007643 A1    Jan. 12, 2012

(51) Int. Cl.
H03L 7/06 (2006.01)
(52) U.S. Cl. ........ 327/159; 327/147; 327/148; 327/150; 327/156; 327/157; 331/17; 375/374; 375/376
(58) Field of Classification Search .................. 327/105, 327/147, 148, 150, 156, 157, 159; 331/1 R, 331/16, 17, 1 A; 375/373–376
See application file for complete search history.

(56) References Cited

U.S. PATENT DOCUMENTS

| | | | |
|---|---|---|---|
| 4,204,174 A | 5/1980 | King | |
| 5,093,632 A | 3/1992 | Hietala et al. | |
| 5,834,987 A | 11/1998 | Dent | |
| 6,169,457 B1 | 1/2001 | Ichimaru | |
| 6,348,884 B1 | 2/2002 | Steensgaard-Madsen | |
| 6,697,004 B1 | 2/2004 | Galton et al. | |
| 6,737,999 B2 | 5/2004 | Schreier | |
| 6,960,947 B2* | 11/2005 | Albasini et al. | 327/147 |
| 7,068,110 B2* | 6/2006 | Frey et al. | 331/17 |
| 7,271,666 B1* | 9/2007 | Melanson | 331/16 |
| 7,365,607 B2* | 4/2008 | Fahim | 331/1 A |
| 7,961,833 B2* | 6/2011 | Albasini et al. | 375/376 |
| 7,986,250 B2* | 7/2011 | Galton et al. | 341/50 |
| 7,999,622 B2* | 8/2011 | Galton et al. | 331/16 |
| 7,999,623 B2* | 8/2011 | Lin | 331/16 |
| 2004/0223576 A1* | 11/2004 | Albasini et al. | 375/376 |
| 2005/0285685 A1 | 12/2005 | Frey | 331/16 |
| 2010/0327916 A1* | 12/2010 | Ahmadi et al. | 327/107 |

OTHER PUBLICATIONS

Pamarti, et al., "A Wideband 2.4GHz Delta-Sigma Fractional-N PLL With 1-MB/s In-Loop Modulation," IEEE J. Solid-State Circuits, vol. 39, pp. 49-62, Jan. 2004.

Meninger, et al., "A 1-MHs Bandwidth 3.6-GHz 0.18-um CMOS Fractional-N Synthesizer Utilizing a Hybrid PFD/DAC Structure for Reduced Broadband Phase Noise," IEEE J. Solid State Circuits, vol. 41, pp. 966-980, Apr. 2006.

Heng, et al., "A 1.8-GHz CMOS Fractional-N Synthesizer With Randomized Multiphase VCO," IEEE J. Solid State Circuits, vol. 38, pp. 848-854, Jun. 2003.

(Continued)

Primary Examiner — Patrick O'Neill
(74) Attorney, Agent, or Firm — King & Spalding L.L.P.

(57) ABSTRACT

A phase lock loop includes a quantization circuit that generators an out of phase noise cancellation signal from an error in a delta-sigma modulator and applies the noise cancellation signal to the charge pump. The quantization circuit includes a digital-to-analog differentiator. The digital-to-analog differentiator may be, for example, a single-bit first-order digital-to-analog differentiator, a single-bit second-order digital-to-analog differentiator, or a full M-bit binary-weighted digital to analog differentiator.

12 Claims, 12 Drawing Sheets

OTHER PUBLICATIONS

Jian, Heng-Yu, et al., "A Compact 0.8-6GHz Fractional-*N* PLL with Binary-Weighted D/A Differentiator and Offset-Frequency Δ-Σ Modulator for Noise and Spurs Cancellation", 2009 Symposium on VLSI Circuits Digest of Technical Papers, pp. 186-187, Jun. 16, 2009.

Jian, Heng-Yu, et al., "A Fractional-*N* PLL for Multiband (0.8-6 GHz) Communications Using Binary-Weighted D/A Differentiator and Offset-Frequency Δ-Σ Modulator", IEEE Journal of Solid-State Circuits, vol. 45, No. 4; pp. 768-780, Apr. 1, 2010.

International PCT Search Report and Written Opinion, PCT/US2011/043034, 11 pages, Mailed Nov. 23, 2011.

* cited by examiner

BINARY-WEIGHTED DELTA-SIGMA FRACTIONAL-N FREQUENCY SYNTHESIZER WITH DIGITAL-TO-ANALOG DIFFERENTIATORS CANCELING QUANTIZATION NOISE

TECHNICAL FIELD

The present invention relates to delta-sigma fractional-N frequency synthesizers, and more particularly, to delta-sigma fractional-N frequency synthesizers including digital-to-analog differentiators.

BACKGROUND

Many circuits use phase lock loops to generate frequency signals. In an integer-N phase lock loop architecture (such as described below in conjunction with FIG. 1), the phase lock loop includes a phase frequency detector, a charge pump, a loop filter, and a voltage controlled oscillator (VCO), which are connected in series to provide the frequency signal. The frequency signal is fed back through an integer divider to provide a feedback signal to the phase frequency detector. Such architecture has small reference spurs but has course frequency resolution and a long frequency locking time. For some applications, (e.g., wireless communication standards), such an architecture is inflexible.

A fractional-N phase lock loop architecture (such as described below in conjunction with FIG. 3) is similar to the integer-N phase lock loop architecture but includes a fractional divider between the VCO and the phase frequency detector. The fractional divider provides multiple integer dividers that vary so that the average divider may be fractional. Such architecture provides fast locking and fine frequency resolution, but provides fractional spurs due to the varying excess division. The fractional spurs from the charge pump have a larger spike than the integer N phase lock loop architecture.

A Delta-sigma fractional-N phase lock loop architecture (such as described below in conjunction with FIG. 5) is similar to the fractional-N architecture but further includes a delta-sigma modulator for modulating the fractional divider. The delta-sigma modulator receives a select signal R having k number of bits to provide a division ratio of $N+R/2^k$. The high frequency spurs from the charge pump are filtered by the loop filter. The spurs from the charge pump have varying pulse widths, both positive and negative, which appear as noise. The Delta-sigma modulator may be, for example, third order.

In prior art systems, the spurious spurs can also be cancelled at the output of the charge pump by adding an error signal having a fixed pulse width with amplitude controlled by a digital to analog converter. However, the amplitude mismatch in a high resolution DAC severely degrades the performance of the phase lock loop. Using dynamic element matching to reshape such amplitude mismatch to higher frequency can reduce the in-band phase noise. However, it requires additional digital signal processing hardware and complicates DAC design.

SUMMARY

A phase lock loop creates an error signal from amplitude or phase modulation that is applied as an opposed current pulse at a charge pump. In a system using an L-th order MASH delta-sigma modulator, the function $(1-z^{-1})$ can be factored out. Instead of taking the error signal by comparing the input and output of the delta-sigma modulator and integrate it, $e*(1-z^{-1})^{L-1}$, the error signal is tapped directly from a MASH structure, quantize it and multiple by $(1-z^{-1})^{L-2}$. By implementing $(1-z^{-1})$ function in analog domain, any mismatch occurs in the analog circuit is shaped by $(1-z^{-1})$, making it insensitive to the circuit match.

In some aspects, the phase lock loop includes first or second order digital-to-analog differentiators to substantially eliminate the need for dynamic element matching.

In some aspects, the phase lock loop includes digital-to-analog differentiators that enable binary-weighted digital-to-analog converters so that the phase lock loop does not include thermometer-coded digital-to-analog converters.

DETAILED DESCRIPTION

A delta-sigma fractional-N frequency synthesizer with digital-to-analog differentiators canceling quantization noise optimizes phase noise for a wide band system.

The present invention provides methods and systems for canceling the spurious spurs in a delta-sigma fractional-N synthesizer by applying the amplitude-modulated pulse error signal. The spurious spurs are originated from the excess time interval at an input of the phase comparator, which is the quantization noise in the fractional-N synthesizer. The quantization noise can be obtained by comparing input and output of the delta-sigma modulation. By applying the opposite of this known noise as an error signal, the spurious spurs can be removed. Although the noise is zero average and high pass shaped by the delta-sigma modulator, the residual noise is still significant in wideband signal systems. With the amplitude-modulated pulse error signal added to output of the charge pump, the spurious spurs can be minimized.

The present invention provides a delta-sigma fractional-N frequency synthesizer with digital-to-analog differentiators to shape the digital analog conversion elements mismatch without a selection mechanism. The digital-to-analog differentiators may be formed without thermometer-coded digital-to-analog converters. The digital-to-analog differentiators include a first order or a second order mismatch shaping by using local DAC elements that are placed closely and symmetrically. The digital-to-analog differentiators may reduce global matching by using local matching of the digital-to-analog converters.

Figure 1:
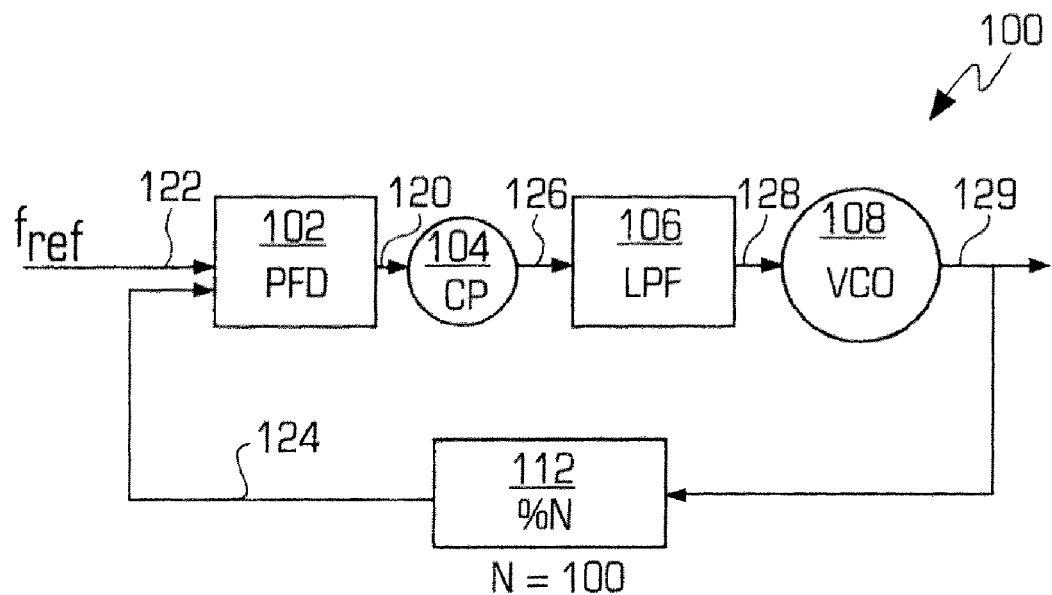
FIG. 1 is a block diagram illustrating a conventional integer phase lock loop.

FIG. 1 is a block diagram illustrating a conventional integer phase lock loop 100, which comprises a phase frequency detector (PFD) 102, a charge pump 104, a loop filter (LPF) 106, a voltage controlled oscillator (VCO) 108, and an integer divider (% N) 112. The phase frequency detector 102 generates a phase frequency signal 120 in response to the difference in frequency and phase of a received reference frequency signal 122 and a fractional feedback frequency signal 124 from the integer divider 112. As an illustrative example, the reference frequency signal 122 has a frequency of 20 MHz. The charge pump 104 generates a boosted voltage signal 126 in response to the phase frequency signal 120. The loop filter 106 generates a filtered boosted voltage signal 128 in response to the boosted voltage 126, and provides the filtered boosted voltage 128 to the VCO 108. In one embodiment, the loop filter 106 is a low pass filter. The VCO 108 generates an output frequency signal 129, which also is applied to the integer divider 112. The integer divider 112 generates the integer feedback frequency signal 124 in response to the output frequency signal 129. As an illustrative example, the N of the integer divider 112 is set to N=100.

Figure 2:
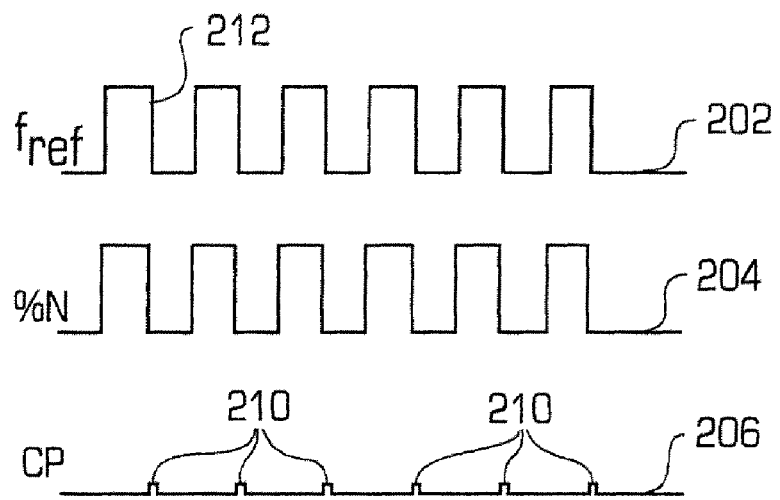
FIG. 2 is a timing diagram illustrating charge pump voltages of a charge pump of the conventional integer phase lock loop of FIG. 1.

FIG. 2 is a timing diagram illustrating the boosted voltage signal 126 from the charge pump 104. A line 202 illustrates the timing of the reference frequency signal 122 applied to the phase frequency detector 102. A line 204 illustrates the timing of the integer feedback frequency signal 124 generated by the integer divider 112. A line 206 illustrates the boosted voltage signal 126 generated by the charge pump 104. The line 206 includes a plurality of reference spurs 210 that occur at a corresponding downward transition 212 of the reference frequency signal 122. (For the sake of clarity, only one downward transition 212 is labeled in FIG. 2). The reference spurs 210 on the boosted voltage signal 126 shown on the line 206 are small. When unmatched, the reference spurs 210 occur with the reference frequency signal 122. However, the phase lock loop 100 has a coarse frequency resolution. Further, the phase lock loop 100 has a long frequency locking time, which depends on a fraction of the clock frequency, and is inflexible for multiple wireless standards. The channel spacing may be different for different standards.

Figure 3:
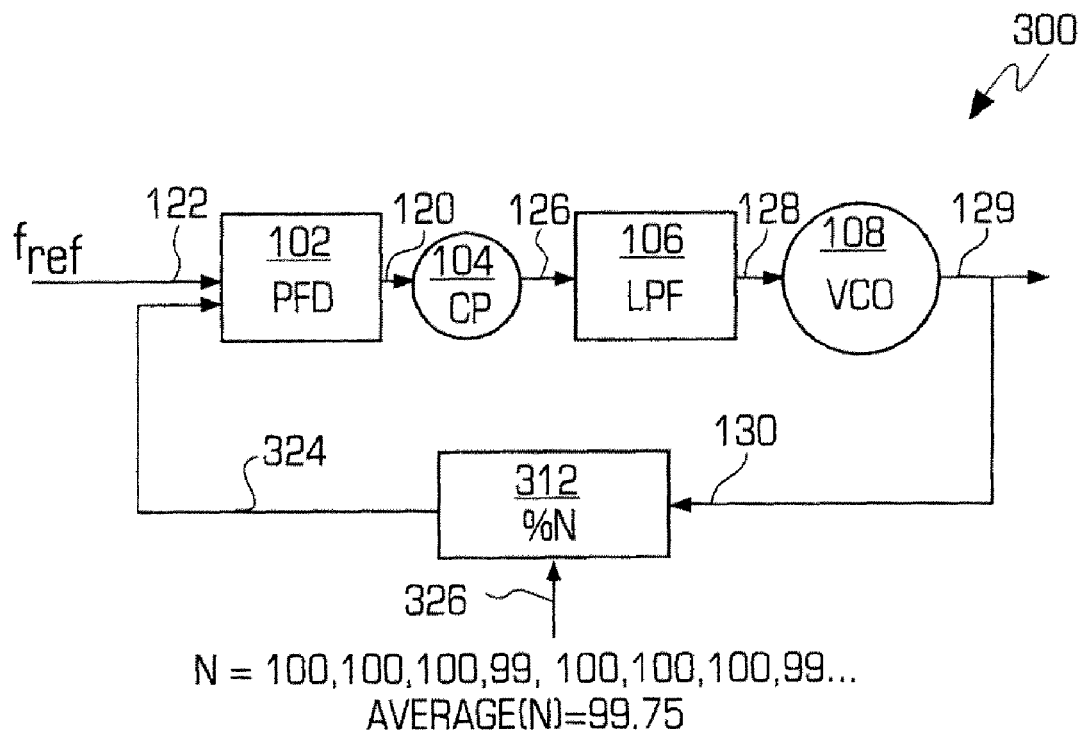
FIG. 3 is a block diagram illustrating a conventional fractional-N phase lock loop.

FIG. 3 is a block diagram illustrating a conventional fractional-N phase lock loop 300. The phase lock loop 300 comprises a phase frequency detector (PFD) 102, a charge pump 104, a loop filter (LPF) 106, a voltage controlled oscillator (VCO) 108, and a fractional divider (% N) 312. The phase frequency detector 102 generates a phase frequency signal 120 in response to the difference in frequency and phase of a received reference frequency signal 122 and a fractional feedback frequency signal 324 from the fractional divider 312. The phase lock loop 300 operates in a similar manner as the phase lock loop 100, except the fractional divider 312 generates the fractional feedback frequency signal 324 in response to a fraction selection signal 326 and the output frequency signal 129. The fraction selection signal 326 may select a plurality of fractions of the fractional divider 312. In an illustrative example, the frequency selection 326 selects a repeating sequence of 100, 100, 100, 99 dividers, which provides an average of 99.75.

Figure 4:
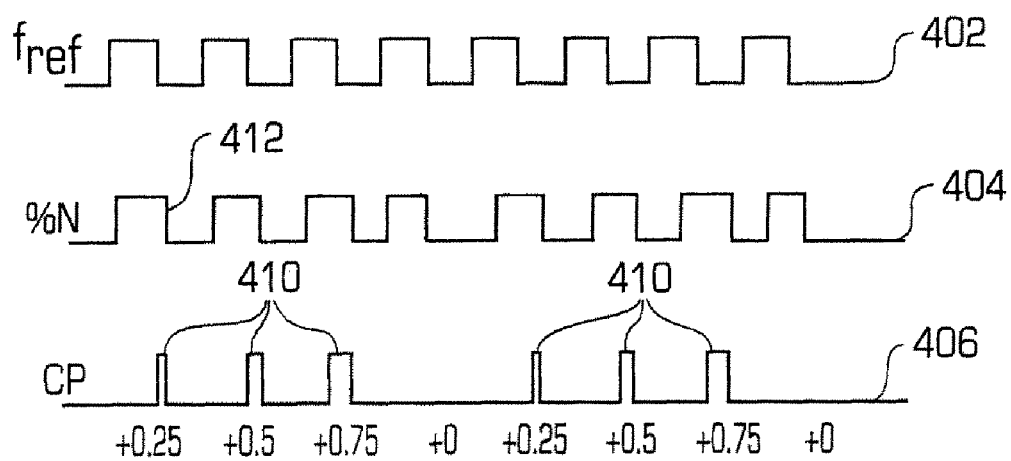
FIG. 4 is a timing diagram illustrating charge pump voltages of a charge pump of the fractional-N phase lock loop of FIG. 3.

FIG. 4 is a timing diagram illustrating the boosted voltage signal from the charge pump 104 of the phase lock loop 300. A line 402 illustrates the timing of the reference frequency signal 122 applied to the phase frequency detector 102. A line 404 illustrates the timing of the fractional feedback frequency signal 324 generated by the fractional divider 312. A line 406 illustrates the boosted voltage signal 126 generated by the charge pump 104. The line 406 includes a plurality of reference spurs 410 that occur at corresponding differences between a downward transition 412 of the fractional feedback frequency signal 324 and a downward transition of the reference frequency signal (fret) 122. (For sake of clarity, only one downward transition 412 is labeled in FIG. 4.) By varying the divide ratio of the fraction selection signal 326, the reference spurs on the line 406 are fractional and have varying width. The loop filter 106 accumulates additional phase. The output of the charge pump 104 has larger spurs than the charge pump 104 of the phase lock loop 100 (FIG. 1). However, the phase lock loop 300 has a fine frequency resolution and fast frequency locking.

Figure 5:
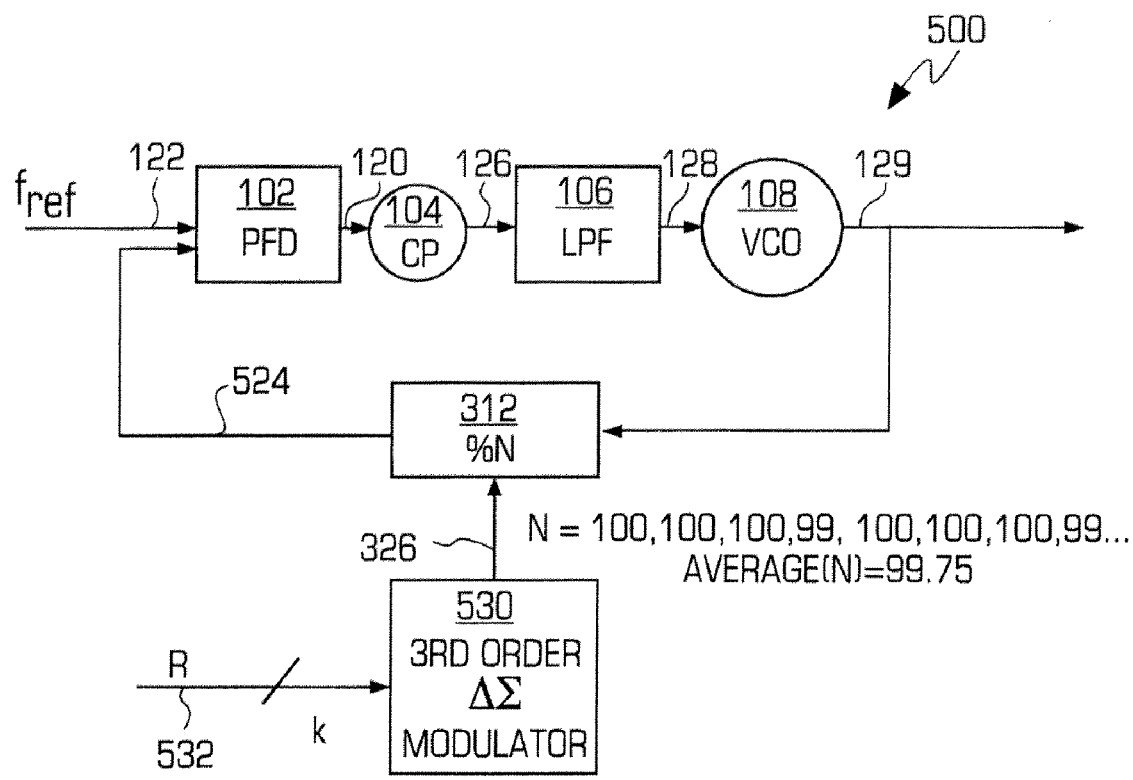
FIG. 5 is a block diagram illustrating a conventional delta-sigma fractional-N phase lock loop including a third order delta-sigma modulator.

FIG. 5 is a block diagram illustrating a conventional delta-sigma fractional-N phase lock loop 500. The phase lock loop 500 comprises a phase frequency detector (PFD) 102, a charge pump 104, a loop filter (LPF) 106, a voltage controlled oscillator (VCO) 108, a fractional divider (% N) 312, and a third order delta-sigma modulator 530. The phase frequency detector 102 generates a phase frequency signal 120 in response to the difference in frequency and phase of a received reference frequency signal 122 and a fractional feedback frequency signal 524 from the fractional divider 312. The phase lock loop 500 operates in a similar manner as the phase lock loop 300, except the fractional divider 312 receives the fraction selection signal 326 from the third order delta-sigma modulator 530 to modulate the division ratio. The fractional divider 312 generates the fractional feedback frequency signal 524 in response to the fraction select signal 326 and the output frequency signal 129. The third order delta-sigma modulator 530 generates the fraction select signal 326 in response to a fraction select signal 532. The division ratio of the fractional divider 312 equals:

$$\text{Ratio} = N + R/2^k$$

where R is the set value of the fraction set signal 532 and k is the number of bits of the fraction set signal 532. In an illustrative example, the reference frequency signal 122 has a frequency fref=20 MHz, the variable k=21 and the frequency resolution is 9 Hz. In an illustrative example, the frequency selection 326 selects a modulated sequence of 100, 100, 99, 99, 99, 102, 100, 99 dividers, which provides an average of 99.75.

Figure 6:
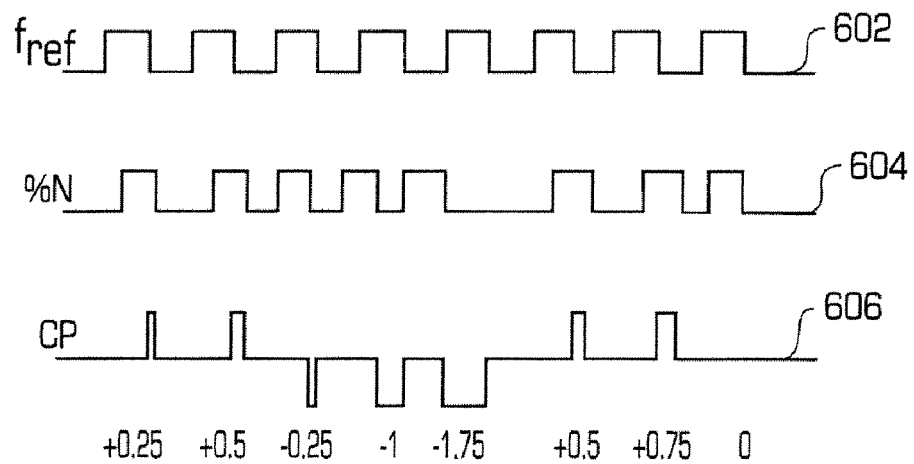
FIG. 6 is a timing diagram illustrating charge pump voltages of a charge pump of the delta-sigma fractional-N phase lock loop of FIG. 5.

FIG. 6 is a timing diagram illustrating charge pump voltages of the charge pump of the phase lock loop 500. A line 602 illustrates the timing of the reference frequency signal 122 applied to the phase frequency detector 102. A line 604 illustrates the timing of the fractional feedback frequency signal 524 generated by the fractional divider 312. A line 606 illustrates the boosted voltage signal 126 generated by the charge pump 104. The line 606 includes a plurality of fractional spurs that occur between downward transitions of the fractional feedback signal 524 and downward transitions of the reference frequency signal (fref) 122. The loop filter 106 filters high frequency spurs. The fractional spurs on the line 606 have varying pulse widths and fixed amplitudes. Furthermore, the fractional spurs of the phase lock loop 500 have a high pass frequency response.

Figure 7:
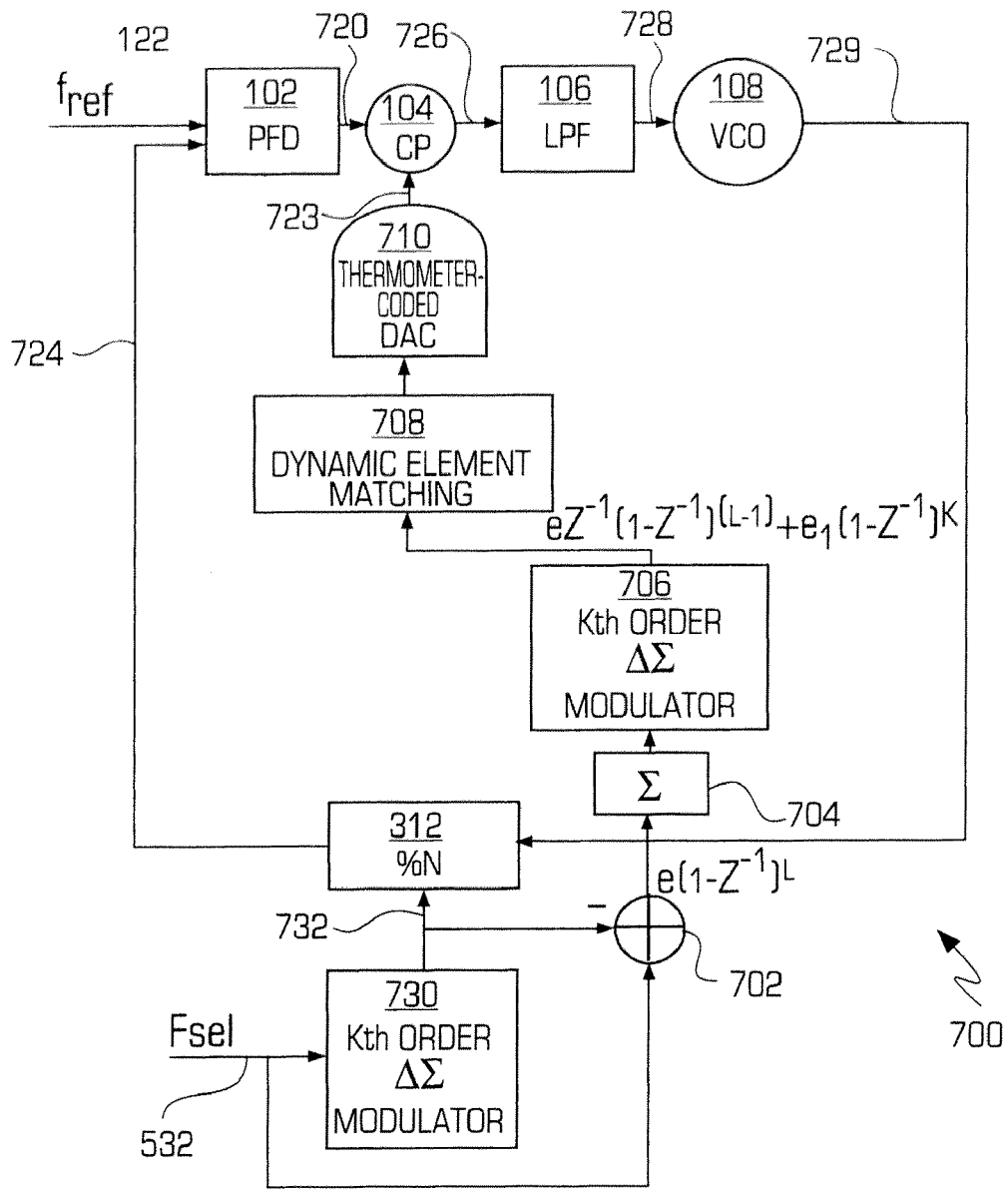
FIG. 7 is a block diagramming illustrating a conventional delta-sigma fractional-N phase lock loop including a k-th order delta-sigma modulator and dynamic element matching.

FIG. 7 is a block diagram illustrating a conventional delta-sigma fractional-N phase lock loop 700 including L-th order delta-sigma modulation and dynamic element matching. The phase lock loop 700 comprises a phase frequency detector (PFD) 102, a charge pump 104, a loop filter (LPF) 106, a voltage controlled oscillator (VCO) 108, a fractional divider (% N) 312, an L-th order delta-sigma modulator 730, a summing circuit 702, an integrator 704, a K-th order delta-sigma modulator 706, a dynamic element matching block 708 and a thermometer-coded digital-to-analog converter (DAC) 710. The phase lock loop 700 operates in a similar manner as the phase lock loop 500, except an L-th order delta-sigma modulator 730 is used instead of a third order delta-sigma modulator 530, and the thermometer-coded DAC 710 provides a signal to the charge pump 104 for dynamic matching and thermometer coding.

The phase frequency detector 102 generates a phase frequency signal 120 in response to the difference in frequency and phase of a received reference frequency signal 122 and a fractional feedback frequency signal 724 from the fractional divider 312. The charge pump 104 provides a boosted voltage signal 726 to the LPF 106 in response to the phase frequency signal 720 and a quantization signal 723 from the thermometer-coded DAC 710.

Figure 10:
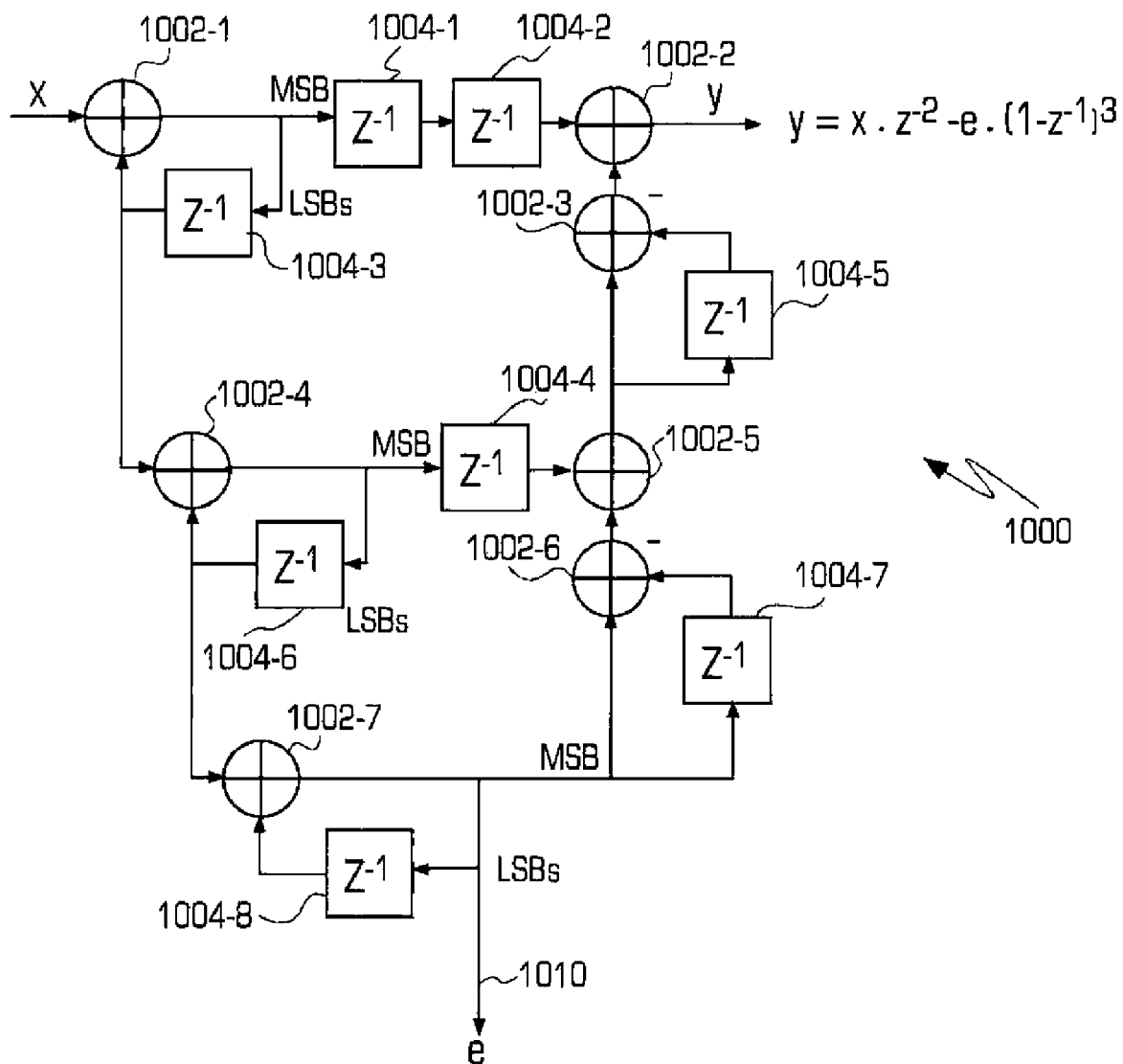
FIG. 10 is a block diagram illustrating a MASH-111 delta-sigma modulator in one embodiment of a third order delta-sigma modulator of the phase lock loop of FIG. 5.

The VCO 108 generates an output frequency signal 729 in response to a filtered boosted signal 728 from the loop filter 106 and applies the signal 729 to the fractional divider 312. The L-th order delta-sigma modulator 730 provides a delta-sigma modulated signal to the fractional divider 312 and a quantization error (e) signal 732 to the summing circuit 702. The L-th order delta-sigma modulator 730 may be, for example, a third order delta-sigma modulator 530 (FIG. 5), or a MASH-111 delta-sigma modulator 1000 (FIG. 10).

The summing circuit 702 generate the error signal from the L-th order delta-sigma modulator 730 to the frequency selection signal (Fsel) to provide a transfer function of:

$$ez^{-1}(1-z^{-1})^L$$

The integrator 704 integrates the output of the summing circuit, which is applied to the K-th order delta-sigma modulator 706, which has an output $$ez^{-1}(1-z^{-1})^{L-1}+e_1(1-z^{-1})^K$$

The dynamic element matching block 708 and a thermometer-coded digital-to-analog converter (DAC) 710 generate the quantization signal 723 in response to the output of the K-th order delta-sigma modulator 706.

Figure 8:
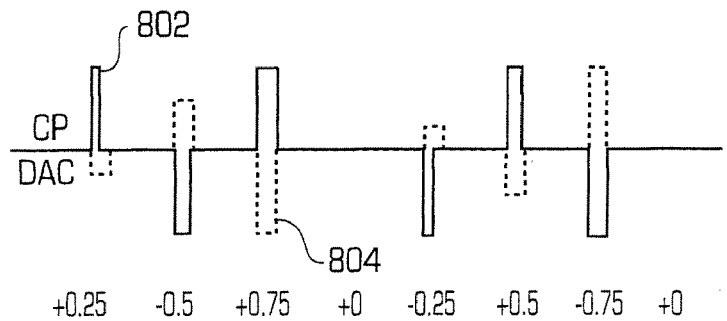
FIG. 8 is a timing diagram illustrating charge pump voltages of the charge pump of the phase lock loop of FIG. 7.

FIG. 8 is a timing diagram illustrating charge pump voltages of the charge pump 104 of the phase lock loop 700 (FIG. 7). A line 802 illustrates the boosted voltage signal 726 generated by the charge pump 104. The dashed line 804 illustrates the output of the DAC 710. The line 804 indicates the added amplitude modulation signal for quantization noise reduction.

Figure 9:
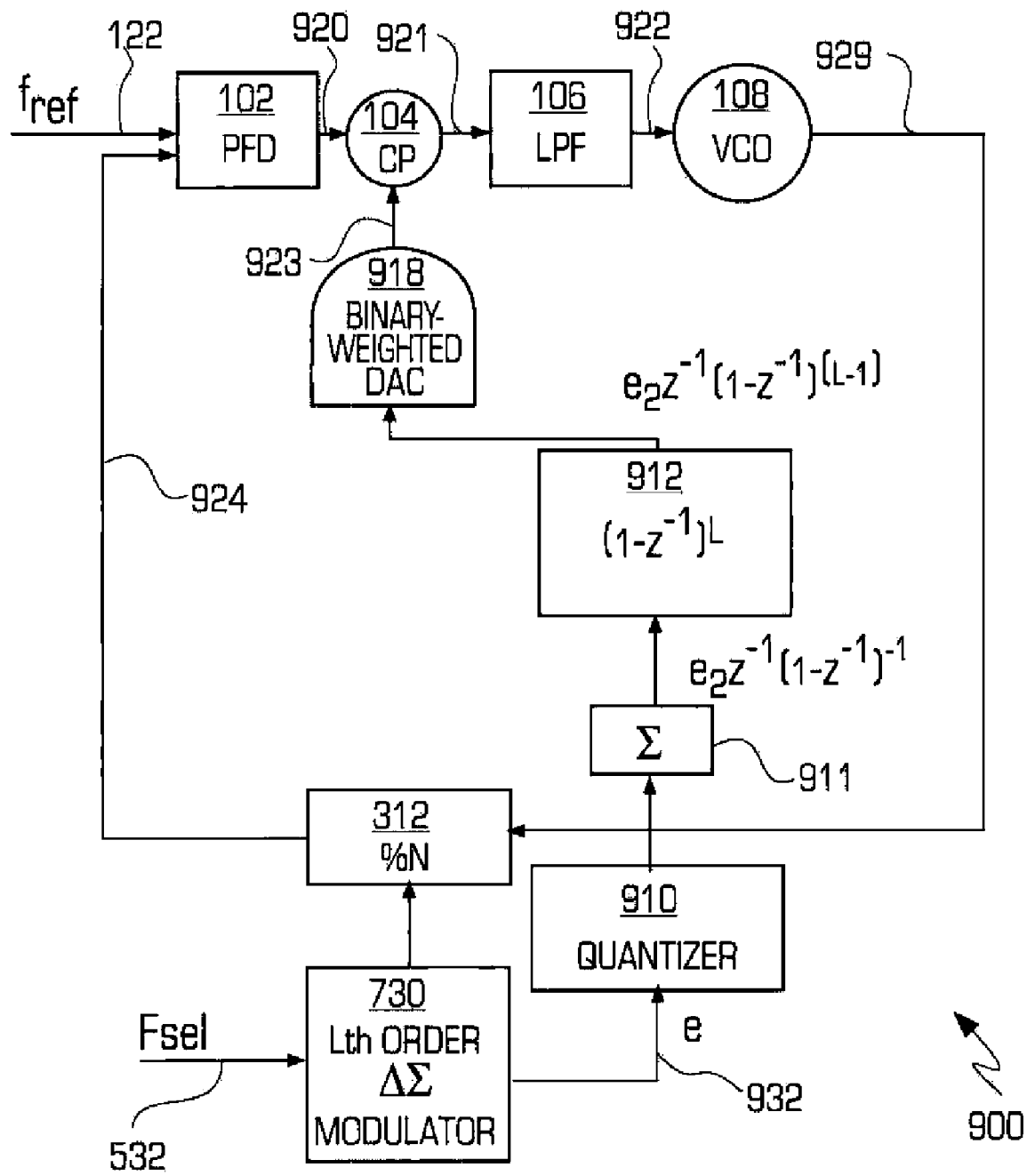
FIG. 9 is a block diagram illustrating an L-th order delta-sigma fractional-N phase lock loop 900 with binary weighted digital-to-analog converter.

FIG. 9 is a block diagram illustrating an L-th order delta-sigma fractional-N phase lock loop 900 with binary weighted digital-to-analog converter. The L-th order delta-sigma fractional-N phase lock loop 900 comprises a phase frequency detector (PFD) 102, a charge pump 104, a loop filter (LPF) 106, a voltage control oscillator (VCO) 108, a fractional divider (% N) 312, an L-th-order delta-signal modulator 730, a quantizer 910, an integrator 911, a differentiator 912 and a binary-weighted digital-to-analog converter (DAC) 918. The phase frequency detector 102 generates a phase frequency signal 920 in response to the difference in frequency and phase of a received reference frequency signal 122 and a fractional feedback frequency signal 924 from the fractional divider 312. The charge pump 104 provides a boosted voltage signal 921 to the LPF 106 in response to the phase frequency signal 120 and a quantization signal 923 from the binary-weighted DAC 918.

The VCO 108 generates an output frequency signal 929 in response to a filtered boosted signal 922 from the loop filter 106 and applies the signal 929 to the fractional divider 312. The L-th order delta-sigma modulator 730 provides a delta-sigma modulated signal to the fractional divider 312 and a quantization error signal 932 to the quantizer 910. The L-th order delta-sigma modulator 730 may be, for example, a third order delta-sigma modulator 530 (FIG. 5), or a MASH-111 delta-sigma modulator 1000 (FIG. 10).

The integrator 911 matches frequency domain to phase conversion. The quantizer 910 generates a fixed pulse with variable amplitude to cancel spurs on the charge pump 104. The differentiator 912 provides the appropriate differential function. For an order L=3, the differentiator 912 provides a second order cancellation. The binary-weighted DAC 918 provides amplitude modulation with a fixed pulse width. The charge pump provides pulse width modulation with fixed amplitude.

The quantizer 910 generates an error signal $e_2$. The integrator 911 has a transfer function for a L-th order delta-sigma modulator 730 of:

$$e_2 z^{-1}(1-z^{-1})^{-1}$$

The differentiator 912 has a transfer function of $$(1-z^{-1})^L$$

and provides an output $$e_2 z^{-1}(1-z^{-1})^{L-1}$$

For a third order delta-sigma modulator (L=3), the output becomes $e_2 z^{-1} (1-z^{-1})^2$.

The phase lock loop 900 has advantages over the phase lock loop 700. The phase lock loop 700 includes an adder 702, an integrator 704, a modulator 706, a dynamic element matching circuit 708, and a thermometer-coded DAC 710. The modulator 706 provides an additional K-th order to quantize the lower bit width. For example, the input to the L-th order delta-sigma modulator 730 may be 21 bits and a 21 bit DAC is impractical, the K-th order delta-sigma modulator 706 is set to handle the additional bits. The input cannot be directly quantized, because the error $e_1$ will not have a high-pass shaping function. The phase lock loop 700 includes an additional modulator, namely the k-th order delta-sigma modulator 706, to quantize the input, while maintaining the $e_1$ shaped with $(1-z^{-1})^k$. The phase lock loop 700 also includes a dynamic element matching circuits 708 that also consumes area and power. The thermometer-coded DAC 710 includes many unit size elements, which use a lot of area to route and to match. In contrast, the phase lock loop 900 includes a binary-weighted DAC 918 having a size that can be scaled directly to the digital bit, in contrast to a thermal coded DAC, such as in the phase lock loop 700. The binary weighting may be implemented without software or a processor.

FIG. 10 is a block diagram illustrating a MASH-111 delta-sigma modulator 1000, which may be used as the third order delta-sigma modulator 530 (FIG. 5). The MASH-111 delta-sigma modulator 1000 comprises a plurality of adders 1002-1 through 1002-7 and a plurality of delay blocks 1004-1 through 1004-8. In one embodiment, the delay blocks 1004 have a $z^{-1}$ transform function in z-transform space. The delay block 1004-5 and the adder 1002-3 form a first differentiator. The delay block 1004-7 and the adder 1002-6 form a second differentiator.

The MASH-111 delta-sigma modulator 1000 has a transfer function of:

$$y = xz^{-2} - e(1-z^{-1})^3$$

where the variable x is the input to the adder 1002-1, the variable e are the LSBs of the output 1010 of the adder 1002-7 and the variable y is the output of the adder 1002-2. The modulator 1000 may also output the error e from the adder 1002-7. The MASH-111 delta-sigma modulator 1000 is unconditionally stable and has low complexity. Further, the MASH-111 delta-sigma modulator 1000 may output directly the unprocessed quantization noise e as the output signal 1010.

Figure 11:
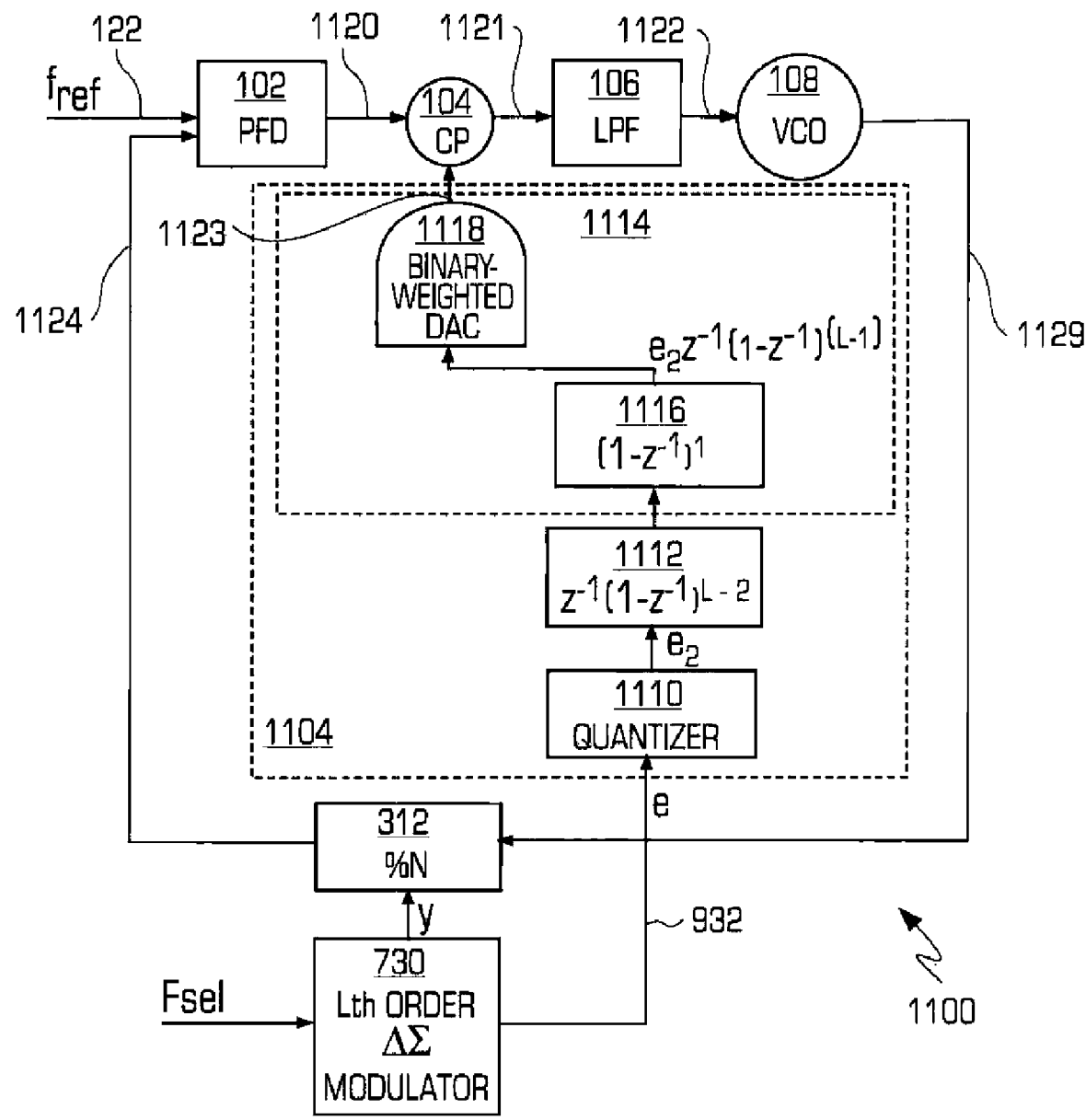
FIG. 11 is a block diagram illustrating an L-th order delta-sigma fractional-N phase lock loop using first order digital-to-analog differentiators.

FIG. 11 is a block diagram illustrating a phase lock loop 1100 including a delta-sigma fractional-N synthesizer using first order digital-to-analog differentiators. The L-th order delta-sigma fractional-N phase lock loop 1100 comprises a phase frequency detector (PFD) 102, a charge pump 104, a loop filter (LPF) 106, a voltage control oscillator (VCO) 108, a fractional divider (% N) 312, an L-th-order delta-signal modulator 730, and a quantizer 1104. The phase frequency detector 102 generates a phase frequency signal 1120 in response to the difference in frequency and phase of a received reference frequency signal 122 and a fractional feedback frequency signal 1124 from the fractional divider 312. The charge pump 104 provides a boosted voltage signal 1121 to the LPF 106 in response to the phase frequency signal 1120 and an error quantization signal 1123 from the quantizer 1104.

The VCO 108 generates an output frequency signal 1129 in response to a filtered boosted signal 1122 from the loop filter 106 and applies the signal 1129 to the fractional divider 312. The L-th order delta-sigma modulator 730 provides a delta-sigma modulated signal to the fractional divider 312 and a quantization error (e) signal 932 to the quantizer 1104 in response to a frequency selection signal (Fsel). The L-th order delta-sigma modulator 730 may be, for example, a third order delta-sigma modulator 530 (FIG. 5), or a MASH-111 delta-sigma modulator 1000 (FIG. 10).

The quantizer 1104 comprises a quantizer 1110, a first transfer function circuit 1112 and a DAC and differentiators block 1114 that includes a second transfer function circuit 1116 and a binary-weighted DAC 1118. The quantizer 1110 generates an error signal $e_2$ from the error (e) signal 932. The first transfer function circuit 1112 is an combination of a delay $Z^{-1}$ and a L–2 order differentiator $(1-Z^{-1})^{L-2}$, and has a transfer function of $$z^{-1}(1-z^{-1})^{L-2}$$

For a third order delta-sigma modulator (L=3), the circuit 1112 has a $z^{-1}(1-z^{-1})$ transfer function. The second transfer function circuit 1116 has a transfer function of:

$$(1-z^{-1})$$

and provides an output $$e_2 z^{-1}(1-z^{-1})^{L-1}$$

For a third order delta-sigma modulator (L=3), the output becomes $e_2 z^{-1} (1-z^{-1})^2$.

Figure 18:
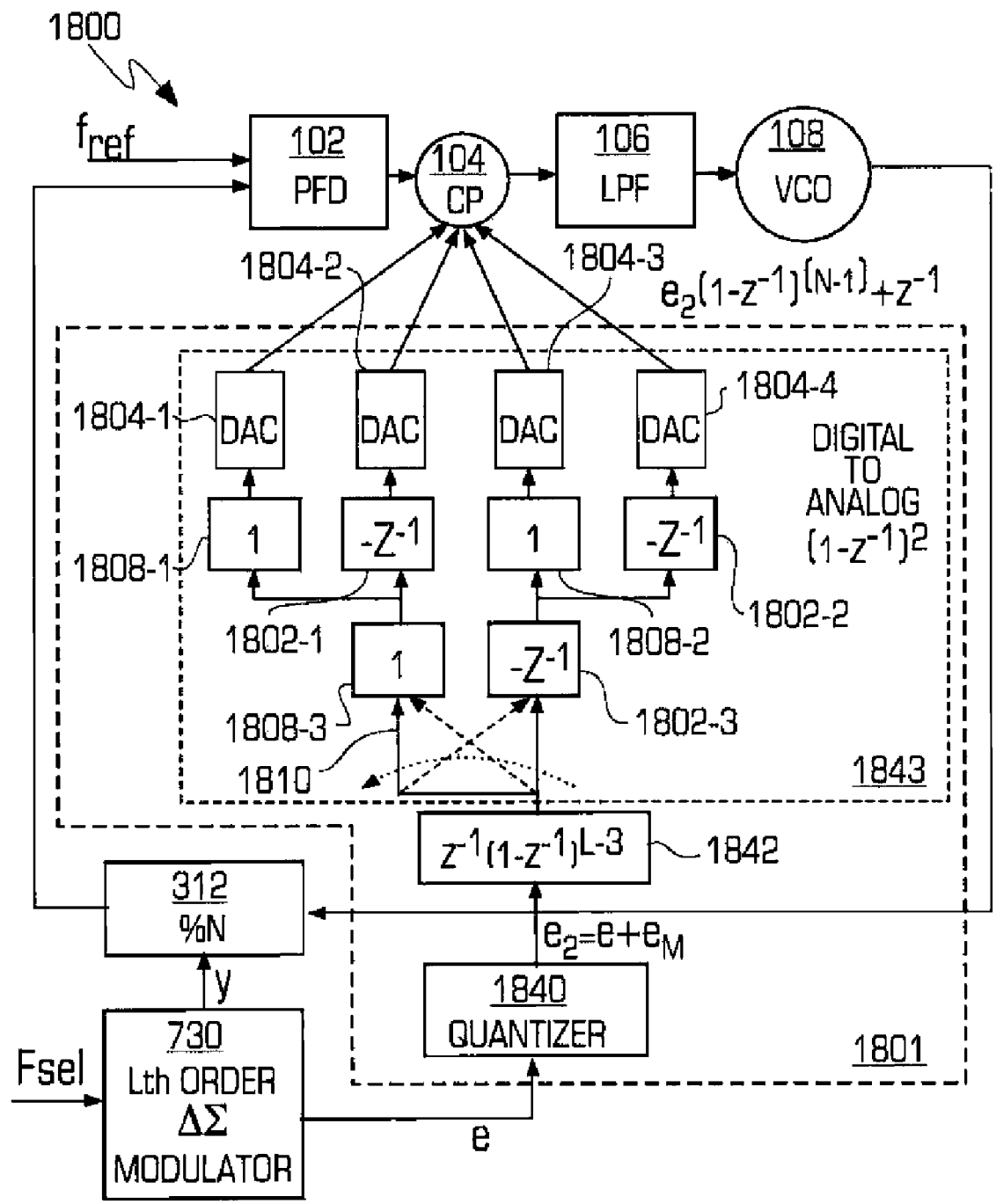
FIG. 18 is a block diagram illustrating a phase lock loop with a delta-sigma fractional-N modulator and a binary-weighted digital-to-analog differentiator of the phase lock loop of FIG. 15.

The underlying configuration and operation of the DAD are described for a single-bit first-order DAD 1200 (FIG. 12), a single-bit second-order DAD 1600 (FIG. 16), a full M-bit 1st order binary-weighted digital to analog differentiator 1404 (FIG. 14) and a full M-bit $2^{nd}$ order binary-weighted digital to analog differentiator 1843 (FIG. 18).

Figures 12, 13:
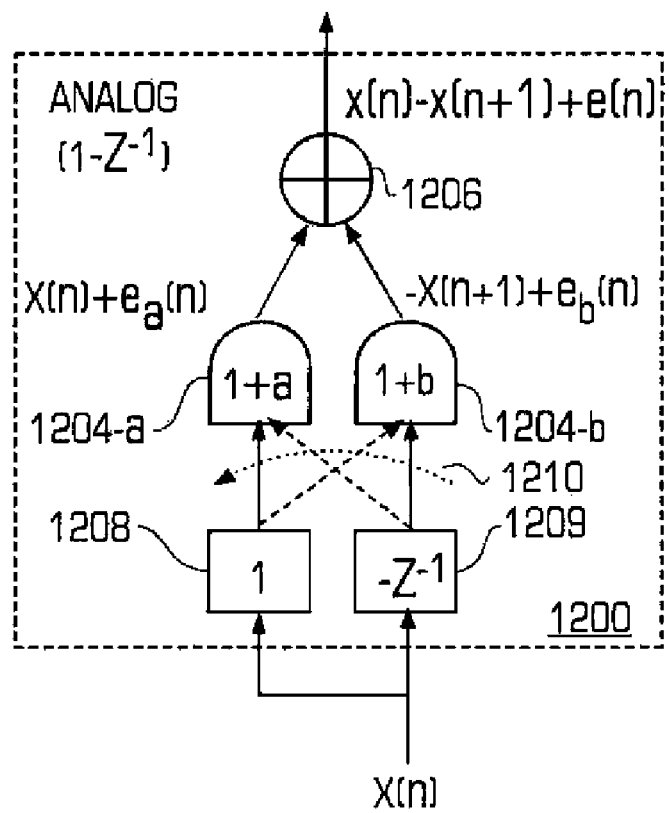
FIG. 12 is a block diagram illustrating a first order digital-to-analog differentiator of the phase lock loop of FIG. 15.
FIG. 13 is a diagram illustrating the processing of the first order digital-to-analog differentiator of FIG. 12.

FIG. 12 is a block diagram illustrating a first order digital to analog differentiator (DAD) 1200. Although the differentiator 1200 is described for a hardware implementation, the differentiator 1200 may be implemented in software executed in a general purpose or special purpose processor, or a combination of hardware and software. The digital to analog differentiator 1200 comprises a plurality of single bit digital to analog converters (DAC) 1204-a and 1204-b, a summing circuit 1206, a unity transfer function block 1208, a delay block 1209, and a switch 1210. In one embodiment, the delay block 1209 has a register delay transfer function (e.g., $-z^{-1}$). The switch 1210 causes the single bit DACs 1204 to swap every other cycle. The output of the unity transfer function block 1208 and the delay block 1209 are pendulously switched between being applied to the single bit DACs 1204-a and 1204-b. The single bit DACs 1204-a and 1204-b have a mismatch of a and b, respectively. The mismatch is shaped by the addition of the outputs from the unity transfer function block 1208 and the delay block 1209, namely to provide a transfer function $(1-z^{-1})$.

The differentiator 1200 is a single-bit and first order DAD including two DACs 1204. The output of the summing circuit 1206 sums the output of the two DACs 1204 to provide the $(1-z^{-1})$ function, while one DAC input complements to the other but with one register delay from the delay block 1209.

FIG. 13 is a diagram illustrating the processing of the first order digital-to-analog differentiator 1200. The sequence x(n) is the output of the single bit DAC 1204-a. The sequence x(n+1) is the output of the single bit DAC 1204-b.

By swapping inputs of the DACs 1204 every other clock cycle, the complementary pair of x(n) and −x(n+1) is rearranged into $x_a(n)$ and $x_b(n)$, forming sequences of complementary data pairs. By grouping every two successive DAC inputs into one cluster, the cluster contents are complementary to each other. The clusters are shown in FIG. 13 as rectangles that include two bits of the sequences x(n) or −x(n+1). By discrete Fourier transforming the output of the DACs 1204 for each of the clusters, the DAC mismatch is shaped by $(1-z^{-1})$ plus a fixed DC value, independent of the incoming signal. Mathematically, the high-pass shaping function can be routinely accomplished in one DAC 1204 without relying on any prescribed selection mechanism.

Because each of the clusters in $x_a(n)$ and $x_b(n)$ is either [1, 0] or [0, 1], the mismatch appearing at the output of the DACs 1204-a, and 1204-b is ([a 0] or [0 a]) and ([b 0] or [0 b]), where a and b are normalized element mismatches. A discrete Fourier transform of the output mismatch from each of the DACs 1204 is performed.

The error of the single bit DAC 1204-a is:

$$e_a(n) = [a\,0] \text{ or } [0\,a] \qquad (1)$$

The summation of the error $e_a$ is:

$$E_a(z) = \sum_{n=0}^{1}\left(e_a(n) - \frac{a}{2}\right)z^{-n} = \pm\frac{a}{2}(1-z^{-1}) \quad (2)$$

The error of the single bit DAC 1204-*b* is:

$$e_b(n+1) = [b0] \text{ or } [0] \quad (3)$$

The summation of the error $e_b$ is:

$$E_b(z) = \sum_{n=0}^{1}\left(e_b(n+1) - \frac{b}{2}\right)z^{-n-1} = \frac{\pm bz^{-1}}{2}(1-z^{-1}) \quad (4)$$

The addition of the summation of the errors $e_a$ and $e_b$ is:

$$E_a(z) + E_b(z) = \frac{\pm a \pm bz^{-1}}{2}(1-z^{-1}) \quad (5)$$

where $e_a(n)$ and $e_b(n)$ are errors present at the output of the DACs 1204-*a* and 1204-*b*, respectively, and the operator '±' represent two possible combinations of the complementary pair. The terms a/2 and b/2 are constant values and may be subtracted from $e_a(n)$ and $e_b(n)$. It is noted from equation (5) that the output mismatch of the single-bit DAD 1204 is automatically shaped by a first-order high-pass function of $(1-z^{-1})$.

Figure 14:
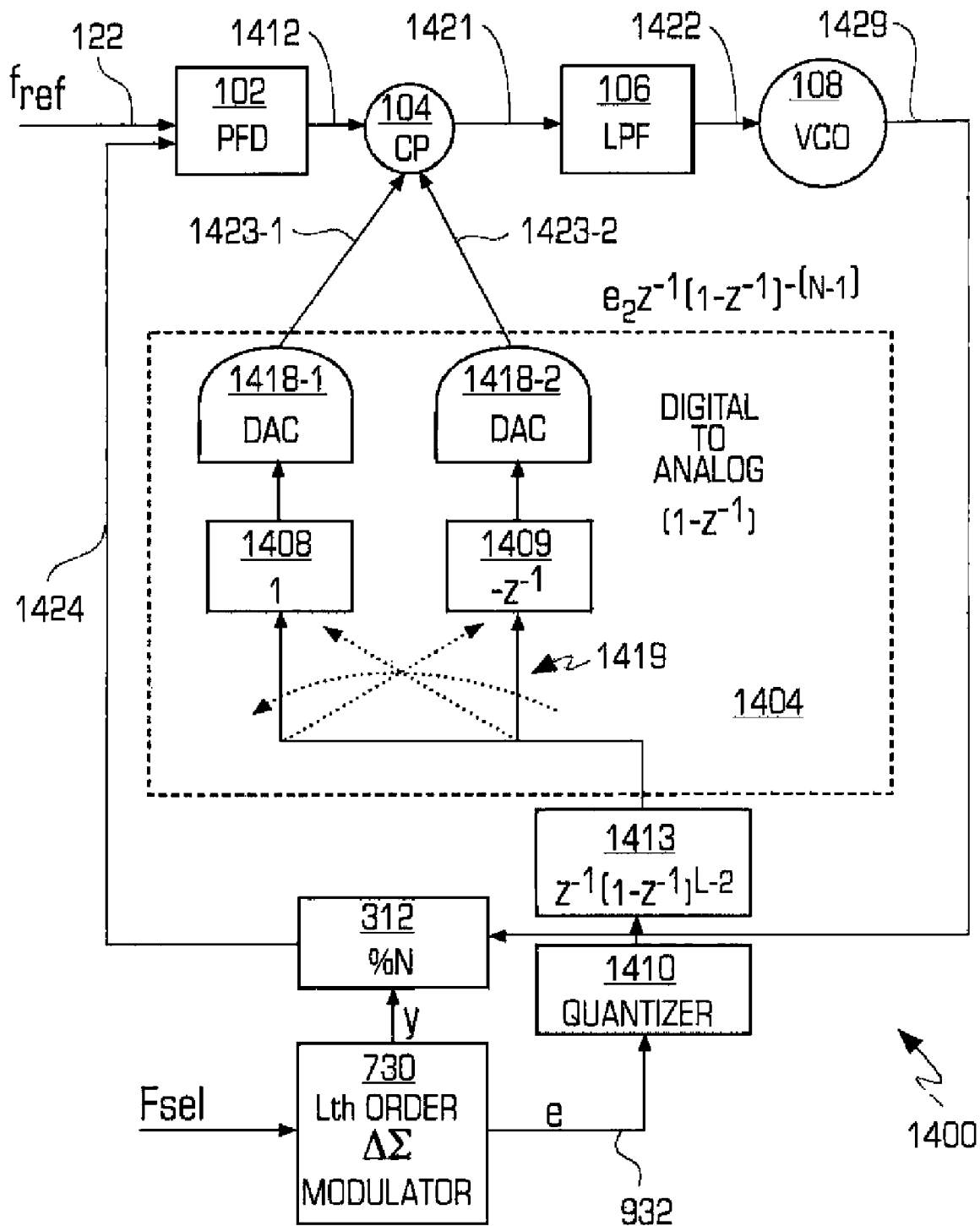
FIG. 14 is a block diagram illustrating a fractional-N phase lock loop including a binary weighted first order digital-to-analog differentiator for mismatch shaping.

FIG. 14 is a block diagram illustrating a fractional-N phase lock loop 1400 that includes a binary weighted first order digital-to-analog differentiator for mismatch shaping. The phase lock loop 1400 comprises a phase frequency detector (PFD) 102, a charge pump 104, a loop filter (LPF) 106, a voltage control oscillator (VCO) 108, a binary weighted first order digital-to-analog differentiator 1404, a quantizer 1410, a fractional divider (% N) 312, a transfer function block 1413, and an L-th-order delta-signal modulator 730. The phase frequency detector 102 generates a phase frequency signal 1412 in response to the difference in frequency and phase of a received reference frequency signal 122 and a fractional feedback frequency signal 1424 from the fractional divider 312. The charge pump 104 provides a boosted voltage signal 1421 to the LPF 106 in response to the phase frequency signal 1412 and error quantization signals 1423-1 and 1423-2 from the digital-to-analog differentiator 1404. The VCO 108 generates an output frequency signal 1429 in response to a filtered boosted signal 1422 from the loop filter 106 and applies the signal 1429 to the fractional divider 312. The L-th order delta-sigma modulator 730 provides a delta-sigma modulated signal to the fractional divider 312 and a quantization error signal 932 to the quantizer 1410 in response to a frequency selection signal (Fsel). The L-th order delta-sigma modulator 730 may be, for example, a third order delta-sigma modulator 530 (FIG. 5), or a MASH-111 delta-sigma modulator 1000 (FIG. 10).

The binary-weighted digital-to-analog differentiator 1404 comprises a unity transfer function bock 1408, a delay block 1409, a plurality of single bit digital-analog converters (DAC) 1418-1 through 1418-2, and a switch 1419. The switch 1419 pendulously switches between applying the output from the transfer function block 1413 to the unity block 1408 and the delay block 1409 in a similar manner as described below for the DADs 1200 and 1600. The binary-weighted digital-to-analog differentiator 1404 provides mismatch shaping.

Figure 15:
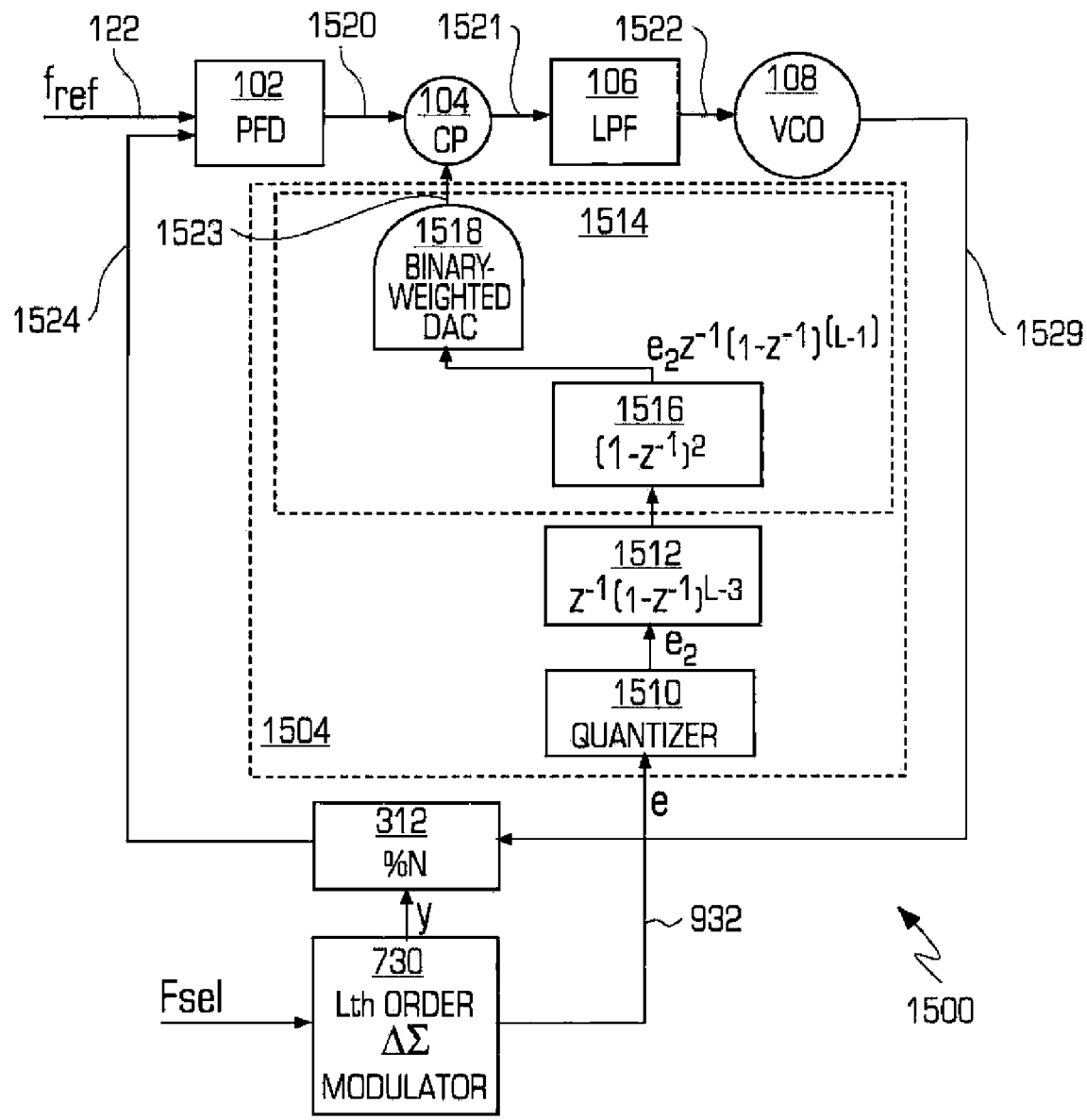
FIG. 15 is a block diagram illustrating a phase lock loop including a delta-sigma fractional-N synthesizer using second order digital-to-analog differentiators.

FIG. 15 is a block diagram illustrating a phase lock loop 1500 including a delta-sigma fractional-N synthesizer using second order digital-to-analog differentiators. The L-th order delta-sigma fractional-N phase lock loop 1500 comprises a phase frequency detector (PFD) 102, a charge pump 104, a loop filter (LPF) 106, a voltage control oscillator (VCO) 108, a fractional divider (% N) 312, an L-th-order delta-signal modulator 730, and a quantizer 1504. The phase frequency detector 102 generates a phase frequency signal 1520 in response to the difference in frequency and phase of a received reference frequency signal 122 and a fractional feedback frequency signal 1524 from the fractional divider 312. The charge pump 104 provides a boosted voltage signal 1521 to the LPF 106 in response to the phase frequency signal 1512 and an error quantization signal 1523 from the quantizer 1504.

The VCO 108 generates an output frequency signal 1529 in response to a filtered boosted signal 1522 from the loop filter 106 and applies the signal 1529 to the fractional divider 312. The L-th order delta-sigma modulator 730 provides a delta-sigma modulated signal to the fractional divider 312 and a quantization error (e) signal 932 to the quantizer 1504 in response to a frequency selection signal (Fsel). The L-th order delta-sigma modulator 730 may be, for example, a third order delta-sigma modulator 530 (FIG. 5), or a MASH-111 delta-sigma modulator 1000 (FIG. 10).

The quantizer 1504 comprises a quantizer 1510, a first transfer function circuit 1512 and a DAC and differentiators block 1514 that includes a second transfer function circuit 1516 and a binary-weighted DAC 1518. The quantizer 1510 generates an error signal $e_2$ from the quantization error signal (e) 932. The first transfer function circuit 1512 is an combination of an integrator $Z^{-1}/(1-Z^{-1})$ and a L−2 order differentiator $(1-Z^{-1})^{L-2}$, and has a transfer function of:

$$z^{-1}(1-z^{-1})^{L-3}$$

For a third order delta-sigma modulator (L=3), the circuit 1512 has a $z^{-1}$ transfer function. The second transfer function circuit 1516 has a transfer function of $$(1-z^{-1})^2$$

and provides an output $$e_2 z^{-1}(1-z^{-1})^{L-1}$$

For a third order delta-sigma modulator (L=3), the output becomes $e_2 z^{-1} (1-z^{-1})^2$.

Figure 16:
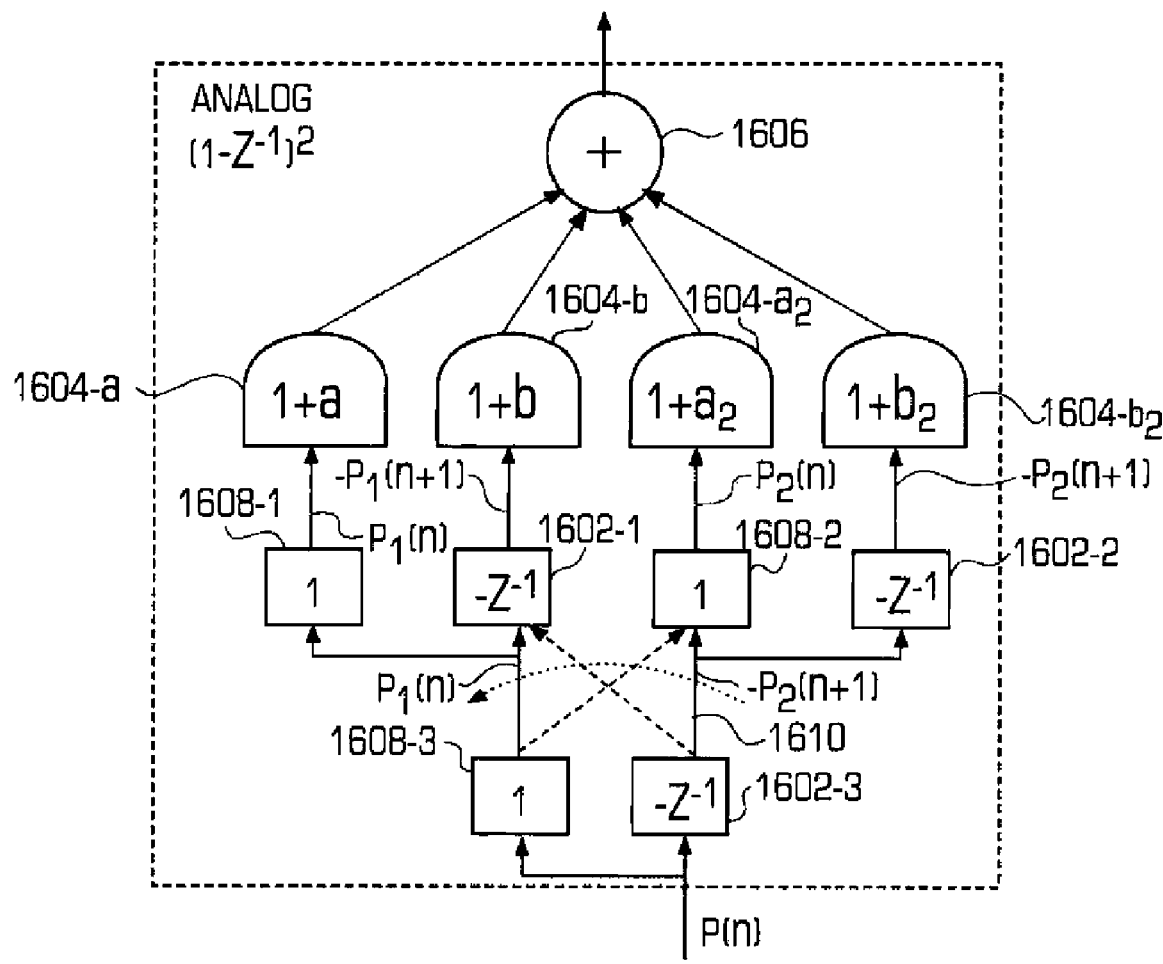
FIG. 16 is a block diagram illustrating a second order digital-to-analog differentiator of the phase lock loop of FIG. 15.

FIG. 16 is a block diagram illustrating a second order digital-to-analog differentiator (DAD) 1600. Although the differentiator 1600 is described for a hardware implementation, the differentiator 1600 may be implemented in software executed in a general purpose or special purpose processor, or a combination of hardware and software. The digital-to-analog differentiator 1600 comprises a plurality of delay blocks 1602-1, 1602-2 and 1602-3, a plurality of single bit digital-to-analog converters (DAC) 1604-*a*, 1604-*b*, 1604-*a2*, and 1604-*b2*, a summing circuit 1606, a plurality of unity transfer function blocks 1608-1, 1608-2 and 1608-3, and a switch 1610. Based on the same algorithm of the digital-to-analog differentiator 1200, the second order DAD 1600 may be configured by embedding four DACs 1604 into a two-stage cascaded differentiator to realize the $(1-z^{-1})^2$ function. The mismatch from each DAC 1604-*a*, 1604-*b*, 1604-*a2*, and 1604-*b2* is a, b, $a_2$ and $b_2$, respectively.

Figure 17:
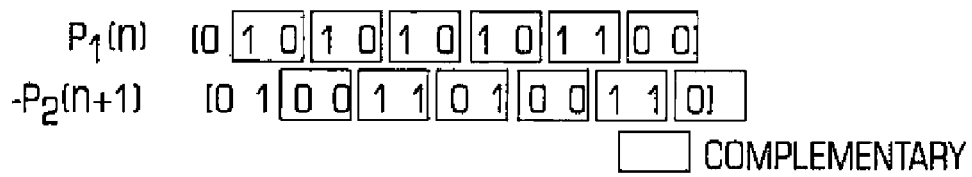
FIG. 17 is a diagram illustrating the processing of the second order digital-to-analog differentiator of FIG. 16.
Figure 17:
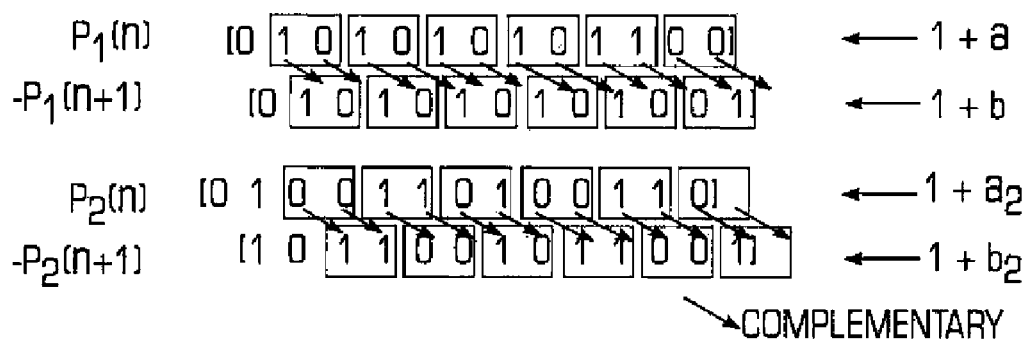

FIG. 17 is a diagram illustrating the processing of the second order digital-to-analog differentiator 1600. The sequence p(n) is the data applied to the unity buffer 1608-3 and the delay block 1602-3. The sequence $p_1(n)$ is the output of the unity block 1608-3. The sequence $p_2(n+1)$ is the output of the delay block 1602-3. The arrows indicate input sequences to each DAC 1604 that are complimentary. Adjacent bits in the sequences that are complementary are shown in rectangles. As the signal swaps every other clock cycle at the first stage output, data contents in each of the $p_1(n)$ and $p_2(n)$ clusters form complementary pairs in a similar manner as described above for the first order DAD 1200. Subsequently, the outputs of second stage differentiators 1604 become $p_1(n)$ and $-p_1(n+1)$ for the DAC 1604-a and 1604-b, and $p_2(n)$ and $-p_2(n+1)$ for the DAC 1604-a2 and 1604-b2 elements respectively. Among them, $-p_1(n+1)$ and $-p_2(n+1)$ are complementary to $p_1(n)$ and $p_2(n)$, respectively, but with a one register delay from the delay block 1602. Therefore, the errors $e_a(n)$ and $e_b(n)$ result in two out of the four possible cluster values in equators (1) and (3), namely.

$$(e_a(n), e_b(n+1)) = ([a0],[0b]) \text{ or } ([0a],[b0]) \qquad (6)$$

Applying equations (6) to equations (2), (4) and (5), the output noise at the left half of the second order DAD 1600 becomes:

$$E_a(z) + E_b(z) = \frac{\pm(a - bz^{-1})}{2}(1 - z^{-1}) \qquad (7)$$

If the mismatch between two DAC elements 1604 are identical, (e.g., a=b). a second order shaping function of $(1-z^{-1})^2$ can be formed as:

$$E_a(z) + E_b(z) = \frac{\pm a}{2}(1 - z^{-1})^2 \qquad (8)$$

This outcome depends only on the left half of the DAC 1604 of the second order DAD 1600. If two DACs 1604 are unmatched, the terms a and b are rewritten in terms of the common mode mismatch, u, and the differential mode mismatch, v, or:

$$a = u+v; b = u-v \qquad (9)$$

Then, equation (7) becomes:

$$E_a(z) + E_b(z) = \frac{\pm u}{2}(1 - z^{-1})^2 + \frac{\pm v(1+z^{-1})}{2}(1 - z^{-1}) \qquad (10)$$

Likewise, the same expression can be derived for the right half of the second order DAD 1600 with the DACs 1604-a2 and 1604-b2, where $u_2$ and $v_2$ are the common and differential mode mismatch, respectively. The combined output noise of $E_{a_2}(z)$ and $E_{b_2}(z)$ can thus be obtained:

$$E_{a_2}(z) + E_{b_2}(z) = \frac{\pm u_2}{2}(1 - z^{-1})^2 + \frac{\pm v_2(1+z^{-1})}{2}(1 - z^{-1}) \qquad (11)$$

According to equations (10) and (11), common mode mismatches of u and $u_2$ still experience a second order high-pass shaping of $(1-z^{-1})^2$, while adjacent mismatches of v and $v_2$ may be filtered by $(1-z^{-1})$. As long as the differential mismatch between adjacent elements is minimized (e.g., v, $v_2 \approx 0$), a second order mismatch shaping function may be realized.

Consequently, the global matching of a traditional multibit DAC can be relaxed to that of the local matching between adjacent DACs 1604. This may be easily accomplished by routing symmetric adjacent cells with interdigitated structure to minimize the process mismatch.

FIG. 18 is a block diagram illustrating a phase lock loop 1800 with a delta-sigma fractional-N modulator and a binary-weighted digital-to-analog differentiator. The phase lock loop 1800 comprises a phase frequency detector 102, a charge pump 104, a loop filter 106, a voltage controlled oscillator 108, a fractional divider (% N) 312, an L-th order delta-sigma modulator 730, and a binary-weighted digital-to-analog differentiator 1801. Although the binary-weighted digital-to-analog differentiator 1801 is described for a hardware implementation, the binary-weighted digital-to-analog differentiator 1804 may be implemented in software executed in a general purpose or special purpose processor, or a combination of hardware and software.

The phase frequency detector 102 generates a phase frequency signal in response to the difference in frequency and phase of a received reference frequency signal (fief) and a fractional feedback frequency signal from the fractional divider 312. The charge pump 104 provides a boosted voltage signal to the LPF 106 in response to the phase frequency signal and error quantization signals from the binary-weighted digital-to-analog differentiator 1801. The VCO 108 generates an output frequency signal in response to a filtered boosted signal from the loop filter 106 and applies the signal to the fractional divider 312. The L-th order delta-sigma modulator 730 provides a delta-sigma modulated signal to the fractional divider 312 and a quantization error signal to the binary-weighted digital-to-analog differentiator 1801 in response to a frequency selection signal (Fsel). The L-th order delta-sigma modulator 730 may be, for example, a third order delta-sigma modulator 530 (FIG. 5), or a MASH-111 delta-sigma modulator 1000 (FIG. 10).

The binary-weighted digital-to-analog differentiator 1804 comprises a quantizer 1840, a transfer function block 1842, and a digital-to-analog differentiator 1843. The digital-to-analog differentiator 1843 comprises a plurality of delay blocks 1802-1 through 1802-3, a plurality of single bit digital-analog converters (DAC) 1804-1 through 1804-4, a plurality of unity transfer function blocks 1808-1 through 1808-3, and a switch 1810. The switch 1810 pendulously switches between applying the output from the transfer function block 1842 to the unity block 1808-3 and the delay block 1802-3 in a similar manner as described above for the DADDs 1200 and 1600.

Compared with the thermometer-coded DAC, the binary-weighted DAC 1804 is easier to implement in a smaller routing area. However, its large differential non-linearity due to the gain error in binary-weighted DAC 1804 often causes high DNL and prevents it from being applied for high resolution applications. By using the DAD 1800 instead, the associated gain error can then be treated as the common mode mismatch from the ideal value and shaped by the high-pass filtering function. Since the linear combination of individually filtered signals from each of the DADs still maintains the high-pass nature, a multi-bit binary-weighted DAD may be implemented without introducing extra in-band noise. Comparing with the prior dynamic element matching method which uses $2^{M+2}$ thermal-coded DAC elements with a prescribed dynamic selection mechanism, this method based on, M-bit binary-weighted digital-to-analog differentiator 1801 can reduce both routing area and circuit complexity.

The unity transfer function blocks described above may be implemented in hardware and/or software implementations of the digital-to-analog differentiators described above.

In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

What is claimed is:

1. A phase lock loop comprising:
a phase frequency detector providing a phase detected signal in response to a reference frequency signal and a divided frequency signal;
a charge pump providing a charge pump signal in response to the phase detected signal and a quantization error signal;
a loop filter providing a filtered control signal in response to the charge pump signal;
a voltage controlled oscillator for providing an output frequency signal in response to the filtered control signal;
a fractional divider providing the divided frequency signal in response to the output frequency signal and a fraction selection signal;
a delta-sigma modulator providing the fraction selection signal and an error signal in response to a divide selection signal; and
a quantizer generating a quantizer output signal fed to an integrator generating a integrator output signal fed to a differentiator generating a differentiator output signal fed to a binary-weighted digital-to-analog converter generating the quantization error signal.

2. The phase lock loop of claim 1 wherein the quantization error signal is an error signal from amplitude or phase modulation that is applied as an opposed current pulse in the charge pump.

3. The phase lock loop of claim 1 wherein the delta-sigma modulator is an L-th order MASH delta-sigma modulator, the quantizer quantizes the error signal, and multiplies the quantized error signal by a factor $z^{-1}(1-z^{-1})^{L-1}$ by means of the integrator and differentiator.

4. The phase lock loop of claim 1, wherein the delta-sigma modulator is an L-th order delta-sigma modulator.

5. The phase lock loop of claim 4, wherein the integrator has a transfer function of $e_2 z^{-1}(1-z^{-1})^{-1}$, wherein $e_2$ is the quantizer output signal.

6. The phase lock loop of claim 5, wherein the differentiator has a transfer function of $(1-z^{-1})^L$, wherein L is the order of the of the delta-sigma modulator.

7. The phase lock loop of claim 6, wherein the charge pump provides pulse width modulation with a fixed amplitude.

8. The phase lock loop of claim 4, wherein the differentiator has a transfer function of $(1-z^{-1})^L$, wherein L is the order of the of the delta-sigma modulator.

9. The phase lock loop of claim 1, wherein the binary weighted digital-to-analog converter provides amplitude modulation with a fixed pulse width.

10. A phase lock loop comprising:
a phase frequency detector providing a phase detected signal in response to a reference frequency signal and a divided frequency signal;
a charge pump providing a charge pump signal in response to the phase detected signal and a quantization error signal;
a loop filter providing a filtered control signal in response to the charge pump signal;
a voltage controlled oscillator for providing an output frequency signal in response to the filtered control signal;
a fractional divider providing the divided frequency signal in response to the output frequency signal and a fraction selection signal;
an L-th order delta-sigma modulator providing the fraction selection signal and an error signal in response to a divide selection signal; and
a quantizer generating a quantizer output signal;
an integrator receiving the quantizer output signal generating a integrator output signal, wherein the integrator has a transfer function of $z^{-1}(1-z^{-1})^{-1}$;
a differentiator receiving the integrator output signal and generating a differentiator output signal, wherein the differentiator has a transfer function of $(1-z^{-1})^L$, wherein L is the order of the of the delta-sigma modulator; and
a digital-to-analog converter receiving the differentiator output signal and generating the quantization error signal comprising amplitude modulation with a fixed pulse width.

11. The phase lock loop of claim 10, wherein the quantization error signal is an error signal from amplitude or phase modulation that is applied as an opposed current pulse in the charge pump.

12. The phase lock loop of claim 10, wherein the delta-sigma modulator is an L-th order MASH delta-sigma modulator, the quantizer quantizes the error signal, and multiplies the quantized error signal by a factor $z^{-1}(1-z^{-1})^{L-1}$ by means of the integrator and differentiator.

* * * * *